(12) United States Patent
Funada et al.

(10) Patent No.: US 6,940,091 B2
(45) Date of Patent: Sep. 6, 2005

(54) SEMICONDUCTOR LASER MODULE AND SEMICONDUCTOR LASER APPARATUS

(75) Inventors: Tomoyuki Funada, Osaka (JP); Masaki Furumai, Osaka (JP)

(73) Assignee: Sumitomo Electric Industries, Ltd.

(*) Notice: Subject to any disclaimer, the term of this patent is extended or adjusted under 35 U.S.C. 154(b) by 71 days.

(21) Appl. No.: 10/645,990

(22) Filed: Aug. 22, 2003

(65) Prior Publication Data

US 2004/0037334 A1 Feb. 26, 2004

(51) Int. Cl.⁷ .................................................. H01L 29/06
(52) U.S. Cl. ........................................................ 257/21
(58) Field of Search ............................... 385/88, 89, 92, 385/93; 257/233, 461, 462

(56) References Cited

U.S. PATENT DOCUMENTS 5,764,826 A * 6/1998 Kuhara et al. ................ 385/24
6,521,968 B2 * 2/2003 Kuhara et al. ............... 257/461
6,540,412 B2 * 4/2003 Yonemura et al. ............ 385/88

OTHER PUBLICATIONS

Maruyama et al., Optical Communication Module, Pub. date Oct. 21, 2004.*

* cited by examiner

Primary Examiner—David Nelms
Assistant Examiner—Mai-Huong Tran
(74) Attorney, Agent, or Firm—Fish & Richardson P.C.

(57) ABSTRACT

A semiconductor laser module has a stem base and a stem block provided thereon. A submount is fixed on the block, and a laser diode (LD) is mounted on the submount. Transmission lines are formed on the submount and connected to the anode and cathode of the LD. Lead pins extend through the stem base to be connected to the transmission lines. A photodetector is disposed, below the LD, on the stem base. Aperture for placement of the photodetector is formed in the submount, and the photodetector is placed at least partially in this aperture.

19 Claims, 19 Drawing Sheets

(PRIOR ART)

SEMICONDUCTOR LASER MODULE AND SEMICONDUCTOR LASER APPARATUS

BACKGROUND OF THE INVENTION

1. Field of the Invention

The present invention relates to a semiconductor laser module and a semiconductor laser apparatus using the same.

2. Related Background Art

A semiconductor laser module is disclosed in Japanese Patent Application Laid-Open No. 11-233876. As shown in FIG. 19, the laser module 70 has a stem base 71 and a stem block 72 disposed on the stem base 71. A submount 73 is placed on the stem block 72, and a laser diode 74 is mounted on the submount 73. The stem base 71 holds lead pins 75 and 76 which extend through the stem base 71 being electrically insulated from the stem base 71.

The lead pin 75 is connected to the anode of the laser diode 74 through a bonding wire 77. The lead pin 76 is connected to the anode through a bonding wire 78 and also to the ground potential. Furthermore, the stem base 71 has a lead pin 79 connected to the cathode of the laser diode 74 through a bonding wire 80, and also to the surface of the submount 73.

Signals are supplied in the differential mode on the transmission path to the position very near the laser diode 74, thereby achieving full balance of the differential load.

In this laser module, the distances between the lead pins and the laser diode is likely to be long, and hence they are connected using bonding wires. This wire-bonding-connection can increase the parasitic inductance of the laser module.

SUMMARY OF THE INVENTION

In one aspect, the present invention relates to a semiconductor laser module comprising: a stem base having a top surface and bottom surface; a submount provided on the top surface of the stem base; a laser diode mounted on the submount; a photodetector placed, below the laser diode, on the stem base; a first lead pin for supplying a normal-phase current to the laser diode, the first lead pin extending through the stem base; and a second lead pin for supplying a reverse-phase current to the laser diode, the second lead pin extending through the stem base. The submount has an aperture in which the photodetector is at least partially disposed.

The aperture may extend through the submount and be open where the aperture faces the stem base. Alternatively, the aperture may be a recess formed on an edge of the submount, and the recess may be open where the recess faces the stem base.

The submount may be a right prism with a base of U-shape or V-Shape, and the aperture may have a cross section of rectangle or triangle. The aperture may have angular or round corners.

The laser diode and the photodetector may have a common optical axis.

The laser diode may have an anode and a cathode. The submount may have first and second transmission lines. The first transmission line may be electrically connected between the first lead pin and one of the anode and cathode, and the second transmission line may be electrically connected between the second lead pin and the other of the anode and cathode.

The laser module may further comprise a stem block provided on the top surface of the stem base. The submount is fixed on the stem block.

The laser module may further comprise: a bonding wire connected between the second transmission line and the other of the anode and cathode; and a via extending through the submount between the second transmission line and the stem block. The stem block may be electrically conductive, and the other of the anode and cathode may be electrically connected to the stem block through the bonding wire, second transmission line, and via.

The first transmission line may include a portion extending parallel to a portion of the second transmission line.

The laser diode may have an optical axis, and the first and second transmission lines may be symmetric with respect to the optical axis.

The submount may have first and second legs extending parallel to each other, and the first and second transmission lines may be disposed on the first and second legs, respectively. The first and second legs may straddle the photodetector.

A resistive element may be provided in at least either of the first and second transmission lines.

The laser module may further comprise a ground lead pin for grounding the stem base. A depression may be formed on the bottom surface of the stem base, and an end of the ground lead pin may be attached to the stem base in the depression.

The laser module may further comprise a cap attached to the stem base, a first sleeve for optical coupling between the laser module and an external optical component, and a second sleeve for interconnection between the cap and the first sleeve. The second sleeve has a first portion placed near the cap and a second portion placed near the first sleeve An outside diameter of the first portion may be smaller than that of the second portion.

A guide groove may be formed on the submount, and an optical fiber may be placed in the guide grove. The guide groove may have a depth at which the optical fiber is aligned with the laser diode to achieve optical coupling.

In another aspect, the present invention relates to a semiconductor laser apparatus comprising: the laser module above described; and a driver circuit board for driving the laser diode of the laser module. The driver circuit board is electrically connected to the first and second input lead pins of the laser module.

The laser module may further comprise a ground lead pin for grounding the stem base. A depression may be formed on the bottom surface of the stem base, and an end of the ground lead pin is attached to the stem base in the depression the driver circuit board may have a ground wiring to be connected to a ground potential. The ground wiring may be in contact with the ground lead pin.

The driver circuit board may be in contact with the bottom surface of the stem base.

The driver circuit board may have a flexible board used for electric connection between the driver circuit board and an external circuit.

The driver circuit board may include a terminating resistor for impedance matching.

Further scope of applicability of the present invention will become apparent from the detailed description given hereinafter. However, it should be understood that the detailed description and specific examples, while indicating preferred embodiments of the invention, are given by way of

DESCRIPTION OF THE PREFERRED EMBODIMENTS

Figure 1:
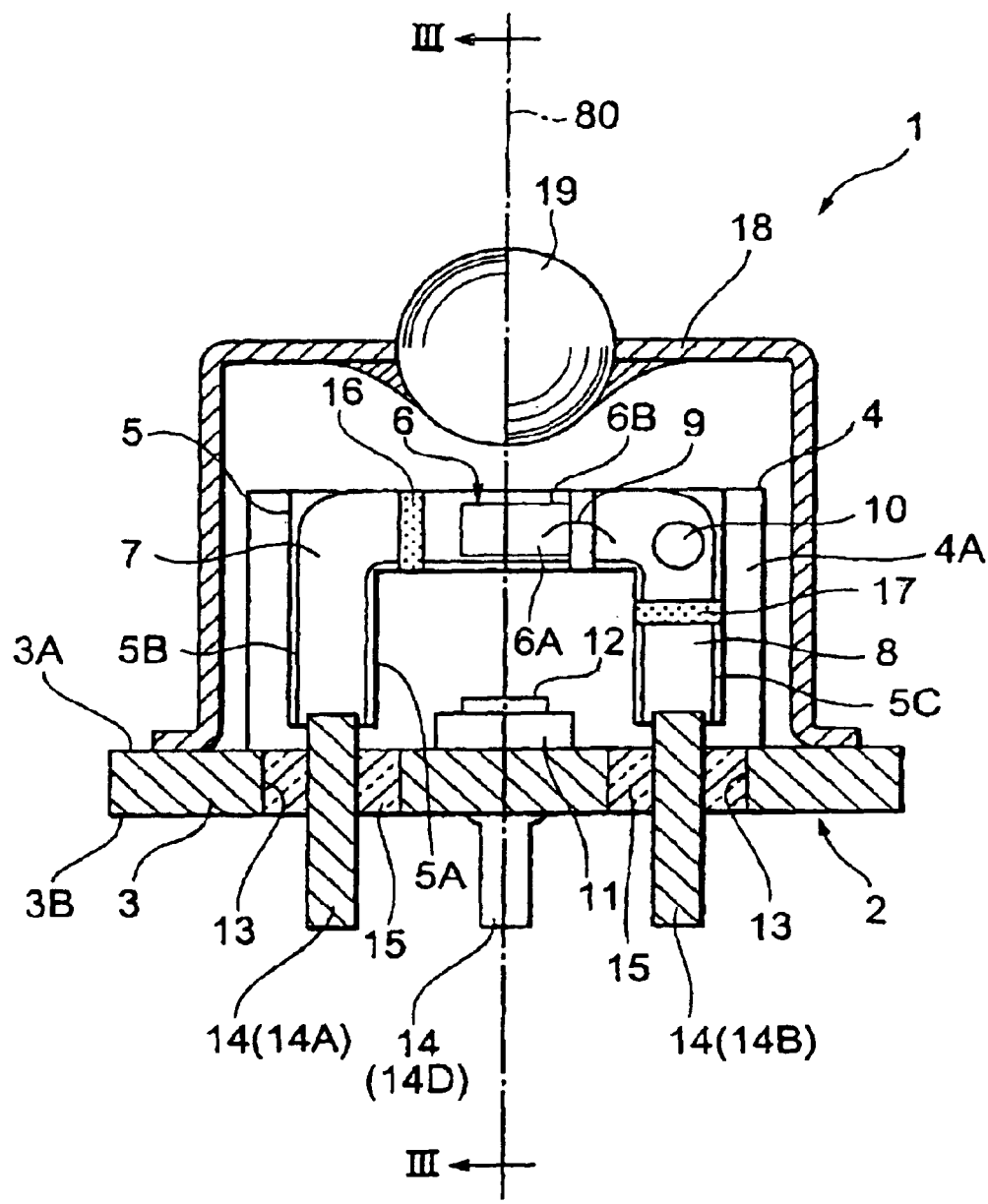
FIG. 1 is a longitudinal sectional view of the semiconductor laser module according to a first embodiment.

The preferred embodiments of the present invention will now be described in greater detail with reference to the accompanying drawings. To facilitate understanding, identical reference numerals are used, where possible, to designate identical or equivalent elements that are common to the embodiments, and, in subsequent embodiments, these elements will not be further explained.

First Embodiment

Figure 2:
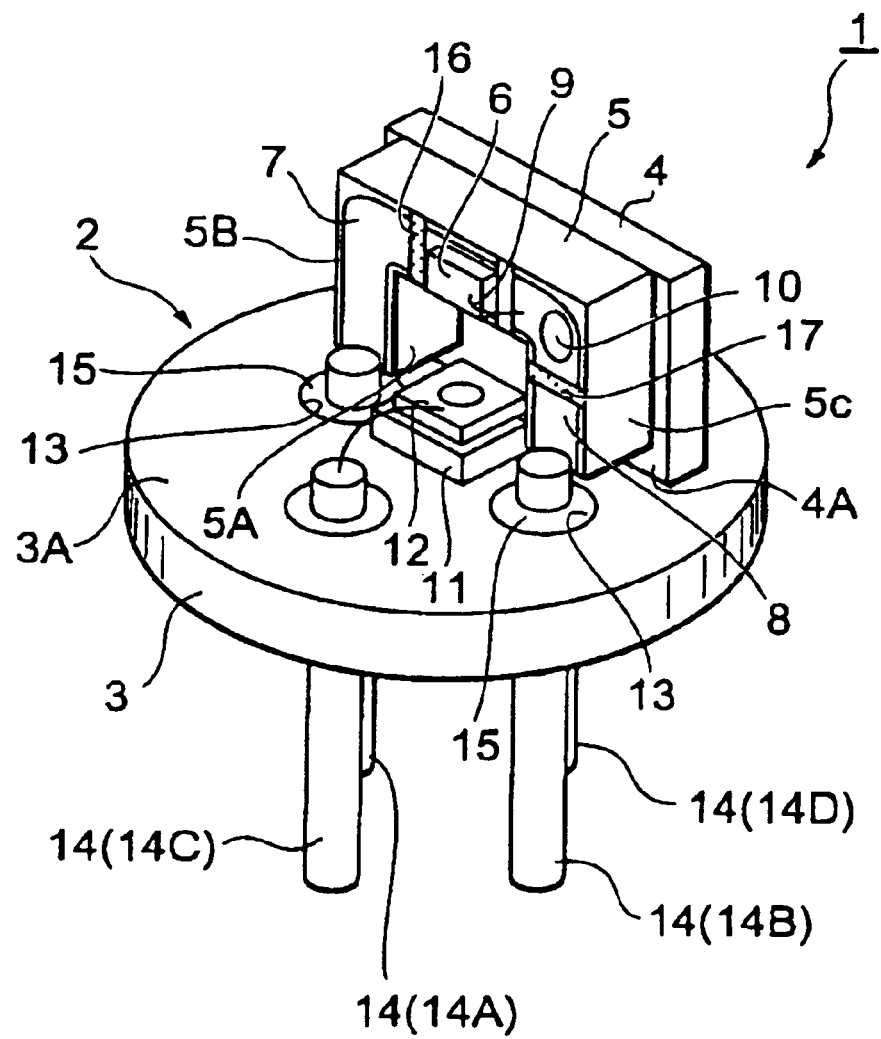
FIG. 2 is a perspective view of the major part of the laser module shown in FIG. 1.
Figure 3:
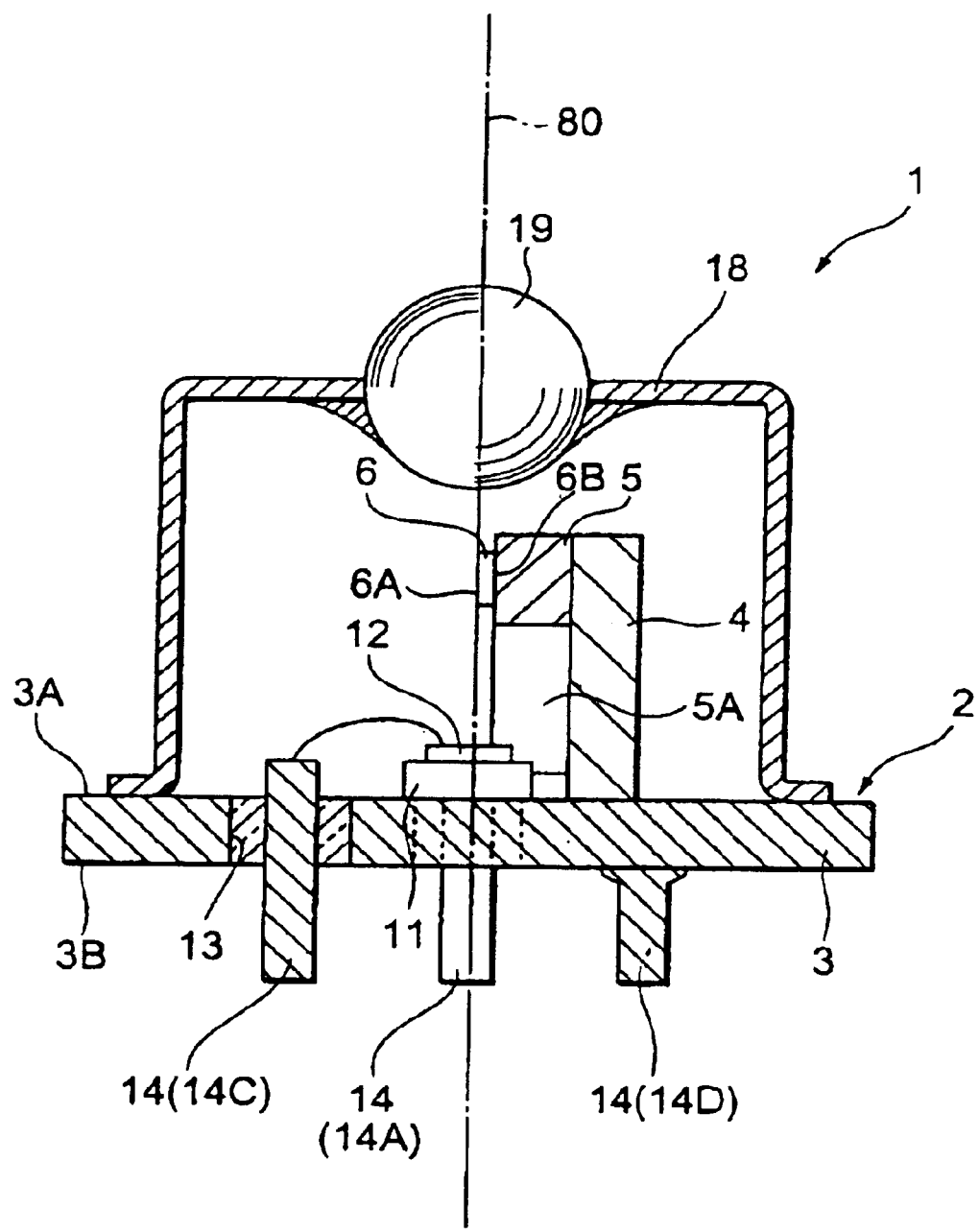
FIG. 3 is a sectional view taken along the line III—III of FIG. 1.

FIG. 1 is a longitudinal sectional view of the semiconductor laser module according to the first embodiment of the present invention, FIG. 2 a perspective view of the major part of the laser module, and FIG. 3 a sectional view taken along the line III—III of the FIG. 1.

As shown in FIGS. 1–3, the semiconductor laser module 1 has a stem 2. The stem 2 includes a stem base 3 made of metal, e.g., iron, and a stem block 4 is also made of metal. The stem base 3 is a circular plate and has the top and bottom surfaces 3A and 3B. The stem block 4 is mounted upright on the top surface 3A of the stem base 3. In this configuration, the stem base 3 is formed as a separate body from the stem block 4, but they may also be formed as an integral body.

A submount 5 for a laser diode (LD) 6 is fixed on the front surface 4A of the stem block 4, and the laser diode 6, which is an optical semiconductor device for emitting light, is mounted on the submount 5. The submount 5 can be made of AlN as well as any ceramic material with good heat conductance, such as SiC, C—BN, diamond or the like. The submount 5 and stem block 4 act as a heat sink for the laser diode 6.

As shown in FIGS. 1 and 2, the submount 5 has reverse U-shape on front view, or so called a gate style. More specifically, the submount 5 is a right prism with a base of U-shape, and therefore the submount 5 has an aperture 5A formed on an edge of the submount 5. The aperture 5A has a rectangular cross section, and is open where it faces the top surface 3A of the stem base 3. A left leg 5B and right leg 5C are provided on the both sides of the aperture 5A. The legs 5B and 5C extend vertically, parallel to each other. The aperture 5A defines space for placement of the photodiode, which will be described later in detail.

In another embodiment, a portion of the stem base 3 may be thicker than the other portion and the submount 5 may be disposed directly on the thicker portion without using the stem block 4.

First and second transmission lines 7 and 8 are formed on the surface, on which the laser diode 6 is mounted, of the submount 5. For example, microstrip lines can be suitably applied to the transmission lines 7 and 8. The widths of the transmission lines 7 and 8 are preferably in a range of 100 $\mu$m to 1 mm, and more preferably 300 to 600 $\mu$m, which are much broader than the diameters of ordinary bonding wires, such as 25 $\mu$m. The transmission lines 7 and 8 are made of electrically conductive material such as Au.

The first transmission line 7 extends from the left leg 5B to the upper central portion of the submount 5 where the laser diode 6 is mounted. The second transmission line 8 extends from the right leg 5C to the vicinity of the laser diode 6. A portion of the transmission line 8 is connected to a via 10 extending through the submount 5 to the front surface 4A of the stem block 4. The laser diode 6 has an anode 6A on its top surface and a cathode 6B on its bottom surface. An end of the transmission line 7 is directly connected to the cathode 6B. On the other hand, the anode 6A is connected to the transmission line 8 with a bonding wire 9. Consequently, the anode 6A is electrically connected to the stem block 4 with the bonding wire 9, transmission line 8 and via 10. In another embodiment, the anode 6A may be electrically connected to the first transmission line 7 and the cathode 6B to the stem block 4.

The laser diode 6 mounted on the submount 5 may be, for example, a Fabry-Perot or DFB laser diode with multiple quantum well structure of InGaAsP/InP. The laser diode 6 has the front facet from which the output laser light is emitted, and the rear facet opposite to the front facet.

The submount 11 for a photodiode (PD) 12 is fixed on the top surface 3A of the stem base 3. The photodiode 12, such as a surface reception type photodiode, is mounted on the top surface of the submount 11 as a photodetector for monitoring laser light from the laser diode 6. The PD submount 11 and the photodiode 12 intrude into the aperture 5A of the LD submount 5 to be partially disposed in the aperture 5A. The left leg 5B and right leg 5C of the submount 5 are located on the both sides of the PD submount 11, and therefore they straddle the photodiode 12.

The first and second transmission lines 7 and 8 are placed on the left and right legs 5B and 5C, respectively, and both extend to the vicinity of the stem base 3. The portion, on the leg 5B, of the transmission line 7 is parallel to the portion, on the leg 5C, of the transmission line 8.

The photodiode 12 has the light receiving surface directed toward the rear facet of the laser diode 6, and receives the laser light leaked from the rear facet. The photodiode 12 and the laser diode 6 have a common optical axis 80, as shown in FIGS. 1 and 3. In other words, the optical axis of the photodiode 12 is aligned with that of the laser diode 6 for optical coupling between these two. This increases the efficiency at which the photodiode 12 receives the laser light from the laser diode 6.

A plurality of through holes 13 (four in this embodiment) are formed in the stem base 3. Lead pins 14 are inserted into the respective through holes 13 with their ends protruding from the stem base 3. Each of the through holes 13 is sealed with glass sealant 15.

An end of the lead pin 14A, which is an input lead pin for normal-phase currents to be supplied to the laser diode 6, is connected to the end of the first transmission line 7. Also, an end of the lead pin 14B, which is an input lead pin for reverse-phase currents to be supplied to the laser diode 6, is connected to the end of the second transmission line 8. The lead pins 14A and 14B may be soldered or wire-bonded to the transmission lines 7 and 8. A driver circuit (not shown) of a differential output type is to be connected to the lead pins 14A and 14B in order to drive the laser diode 6 by differential signal.

The third lead pin 14C is connected to the photodiode 12 for monitoring laser power. The fourth lead pin 14D is attached to the bottom surface 3B of the stem base 3. The stem 2 is kept at the ground potential with the lead pin 14D and thus the anode 6A of the laser diode 6 is electrically connected to the ground potential through the bonding wire 9 and via 10.

A first resistive element 16, which is a thin film resistor, is placed in the first transmission line 7 between the laser diode 6 and the first lead pin 14A. A second resistive element 17, which is also a thin film resistor, is placed in the second transmission line 8 between the via 10 and the second lead pin 14B.

A cap 18 is attached to the top surface 3A of the stem base 3 and covers the laser diode 6, photodiode 12, LD submount 5 and PD submount 11 on the stem base 3, thereby forming a LD package. A lens 19 for condensing the emitted light from the laser diode 6 is provided in the center of the upper wall of the cap 18. Thus the laser module 1 is constructed as a so-called TO-CAN type laser module.

Advantages of the laser module 1 will now be described. The left and right legs 5B and 5C are placed on the opposite sides of the photodiode 12, and the respective transmission lines 7 and 8 are provided on the legs 5B and 5C to be electrically connected to the first and second lead pins 14A and 14B. Consequently, electric signals from the first and second lead pins 14A and 14B can be supplied to the laser diode 6 through the transmission lines 7 and 8. This makes the parasitic inductance of the laser module 1 smaller than that when the lead pins 14A and 14B are directly wire-bonded to the laser diode 6 without transmission lines therebetween. This is because transmission lines have broader widths than those of bonding wires, and also less number of bonding wires are used for connection between the laser diode 6 and the lead pins 14A, 14B.

The LD submount 5 has the aperture 5A as the space for placement of the PD submount 11 and photodiode 12. This makes it possible to dispose the photodiode 12 right below the LD submount 5 to achieve good optical coupling between the laser diode 6 and the photodiode 12. As a result, the photodetector 12 can efficiently receive the light from the laser diode 6.

The transmission lines 7 and 8 are symmetric with respect to the optical axis 80 of the laser diode, thereby improving differential operation of the laser diode 6.

Figure 4:
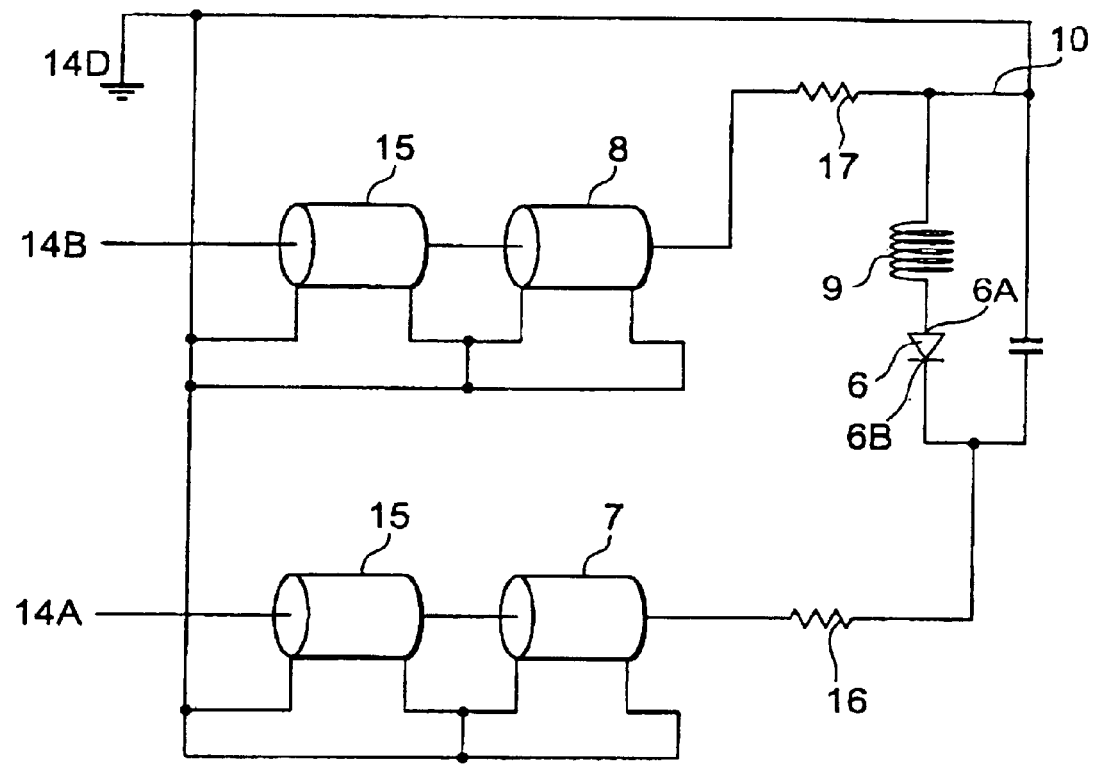
FIG. 4 shows an equivalent circuit of the laser module shown in FIG. 1.

Referring to FIG. 4, other advantages of this embodiment will now be described. FIG. 4 is a diagram showing an equivalent circuit of the laser module 1. As shown in FIG. 4, the first lead pin 14A, to which normal-phase data signals are supplied, is connected to the cathode 6B of the laser diode 6, and the second lead pin 14B, to which reverse-phase data signals are supplied, is connected to the ground potential. The data signals are cancelled at the ground potential by supplying a normal-phase data signal and reverse-phase data signal to the laser diode 6 through the lead pins 14A and 14B with high-frequency currents. As a result, the ground potential becomes stable and radiation noise can be reduced. Accordingly, the laser module 1 has superior high-frequency characteristics.

Furthermore, the laser module 1 has the resistive elements 16 and 17 in the respective transmission lines 7 and 8, and the resistive elements 16 and 17 act as damping resistances. Therefore impedance mismatching can be relaxed between the laser diode 6 and the transmission lines 7, 8.

Figure 5A:
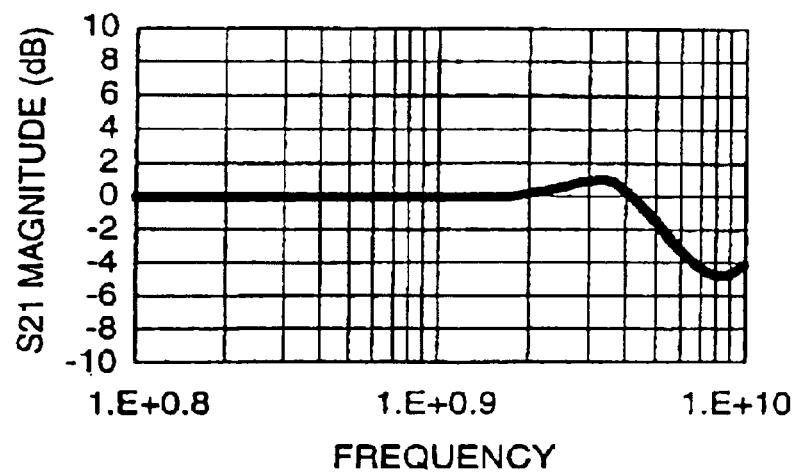
FIG. 5a is a graph showing the frequency response of the laser module shown in FIG. 1.
Figure 5B:
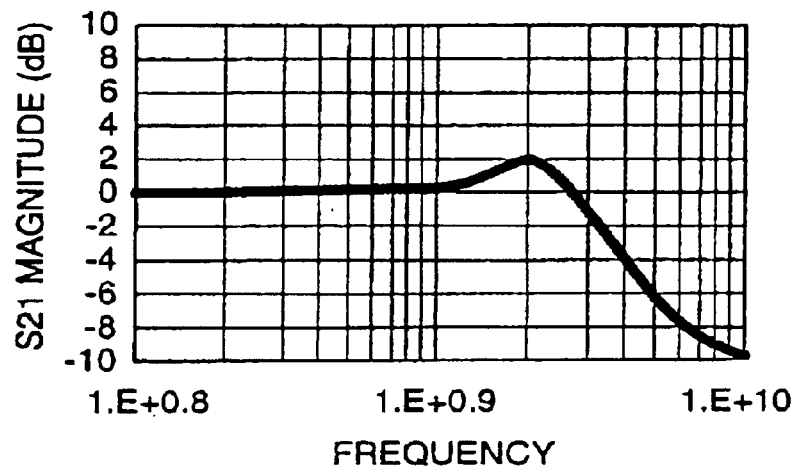
FIG. 5b is a graph showing the frequency response of the conventional laser module.
Figure 19:
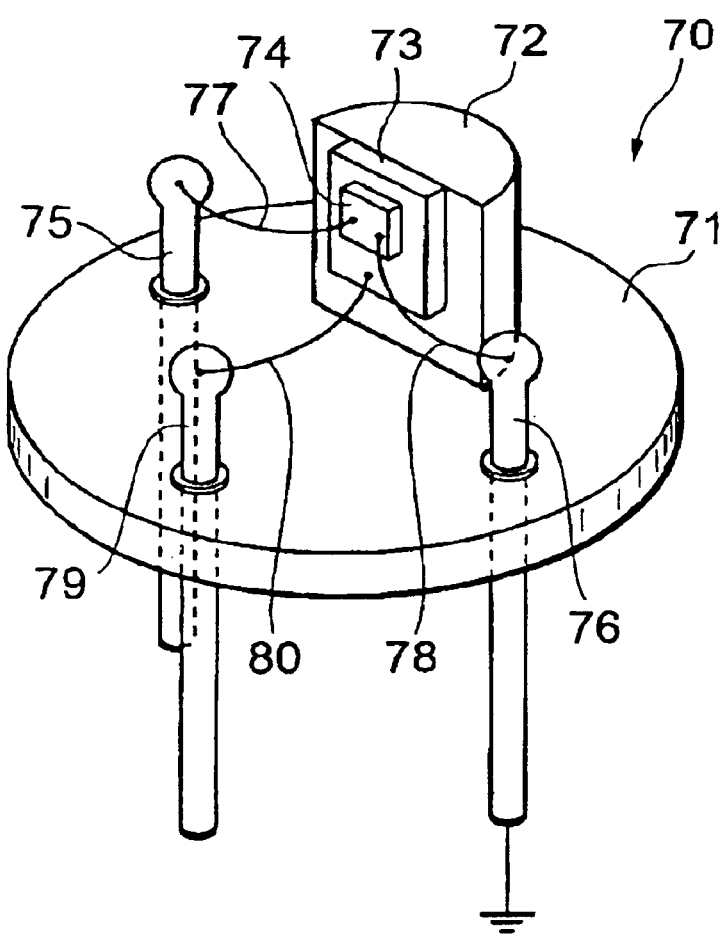
FIG. 19 is a perspective view of the conventional semiconductor laser module.

Referring to FIGS. 5*a* and 5*b*, the high-frequency characteristics of the laser module 1 will now be illustrated. FIG. 5*a* is a graph showing the high-frequency characteristics of the laser module 1 according to this embodiment, and FIG. 5*b* a graph showing the high-frequency characteristics of the laser module shown in FIG. 19, as a comparative example. As shown in FIG. 5*b*, the comparative laser module has a flat transmission characteristic from low frequencies to about 1 GHz. However, it shows a relatively large peak of about 2 dB near 2 GHz. In contrast, as shown in FIG. 5*a*, the laser module 1 displays a flat transmission characteristic from low frequencies to 2 GHz. In addition, it shows only a peak of about 1 dB in the range of 3 to 4 GHz. Thus the laser module 1 of this embodiment displays the superior high-frequency characteristics.

Second Embodiment

Figure 6:
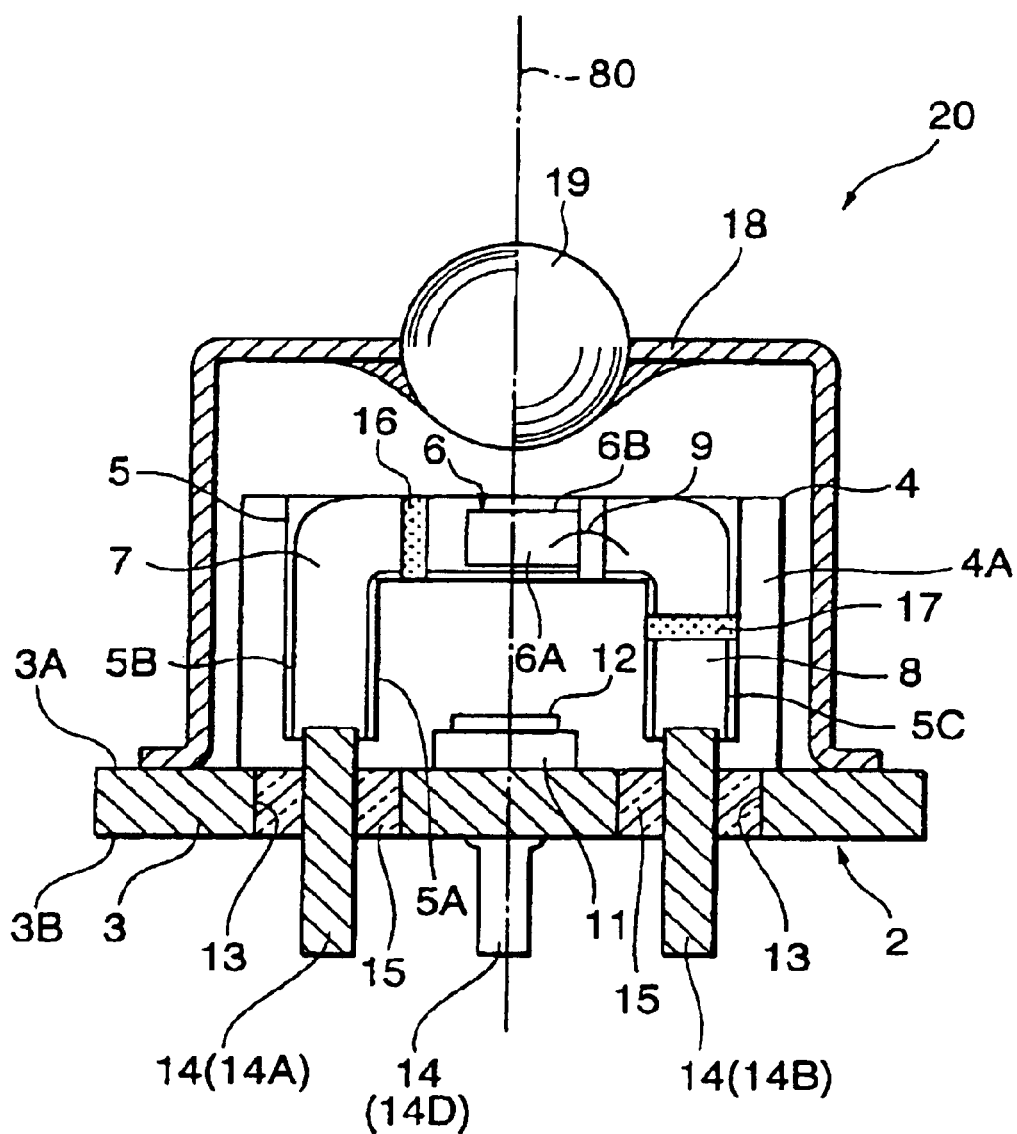
FIG. 6 is a longitudinal sectional view of the semiconductor laser module according to a second embodiment.
Figure 7:
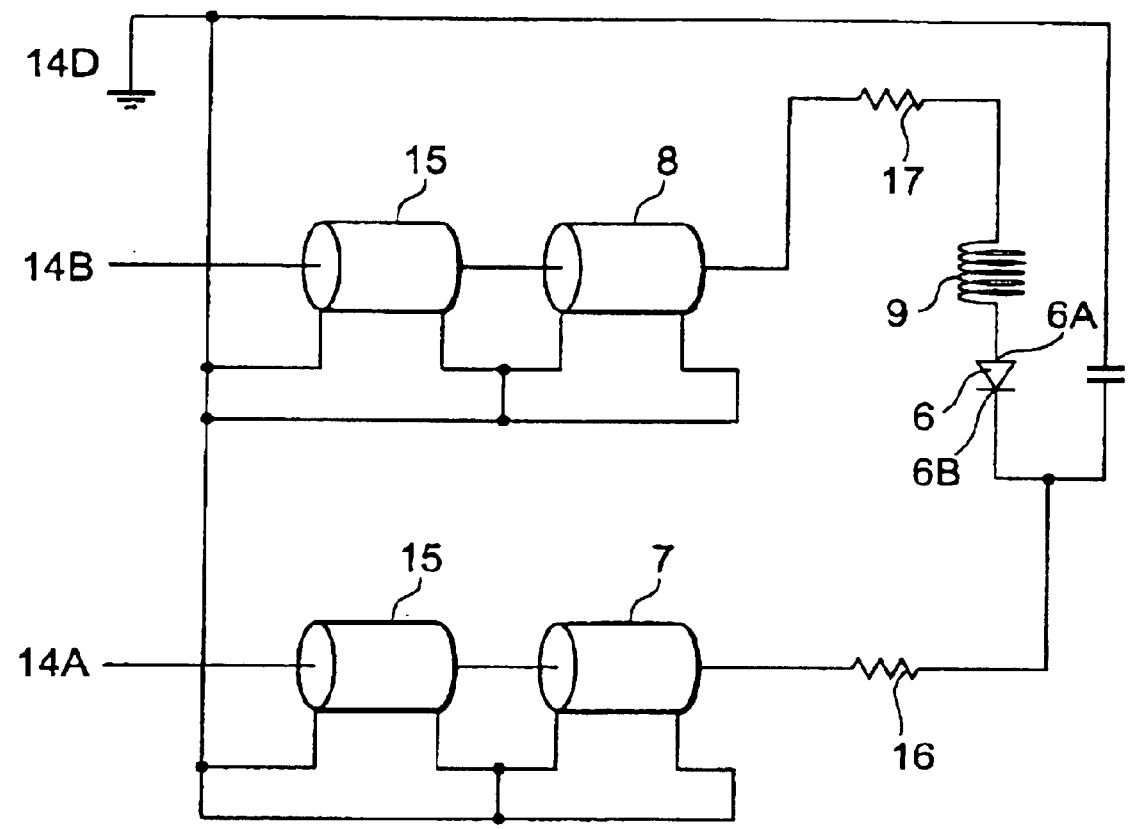
FIG. 7 shows an equivalent circuit of the laser module shown in FIG. 6.

Referring to FIGS. 6 and 7, the second embodiment of the present invention will now be described. FIG. 6 is a longitudinal sectional view of the semiconductor laser module according to this embodiment, and FIG. 7 is a diagram showing an equivalent circuit of the laser module. The laser module 20 of this embodiment differs from the laser module 1 of the first embodiment in that the via 10 is not formed in the LD submount 5. The module 20 has otherwise the same configuration as the first embodiment.

A differential driver circuit (not shown) is to be connected to the first and second lead pins 14A and 14B, and the laser diode 6 is driven by differential signal. Since the transmission line 8 is not electrically connected to the stem block 4 through a via, neither the first transmission line 7 nor the second transmission line 8 is at the ground potential. High-frequency currents hardly flow to the laser package of this embodiment connected (not connected?) to the ground potential, so that the package provides good effect of electromagnetic shield.

Figure 8:
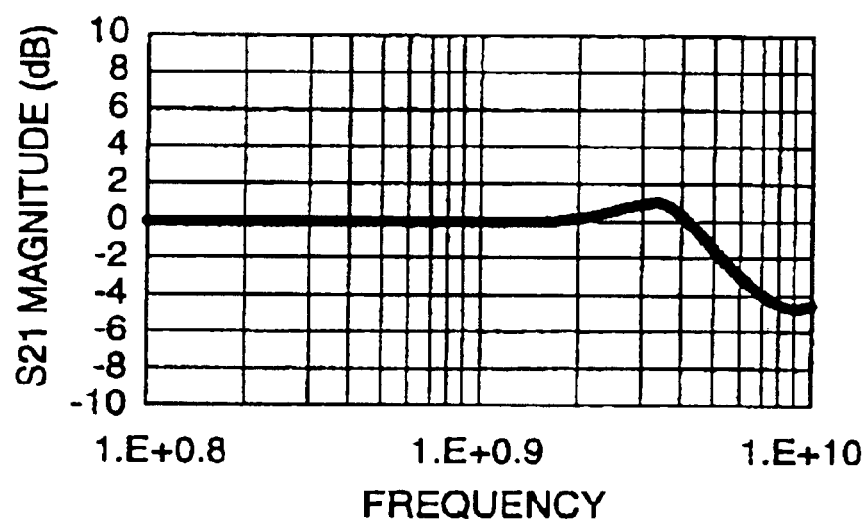
FIG. 8 is a graph showing the frequency response of the laser module shown in FIG. 6.

FIG. 8 is a graph showing the frequency response of the laser module 20. As shown in FIG. 8, the laser module 20 displays a flat transmission characteristic from low frequencies to 2 GHz, similar to the first embodiment. It shows only a peak of about 1 dB in the range of 3 GHz to 4 GHz, and thus the laser module 20 also displays the superior high-frequency characteristics.

Third Embodiment

Figure 9:
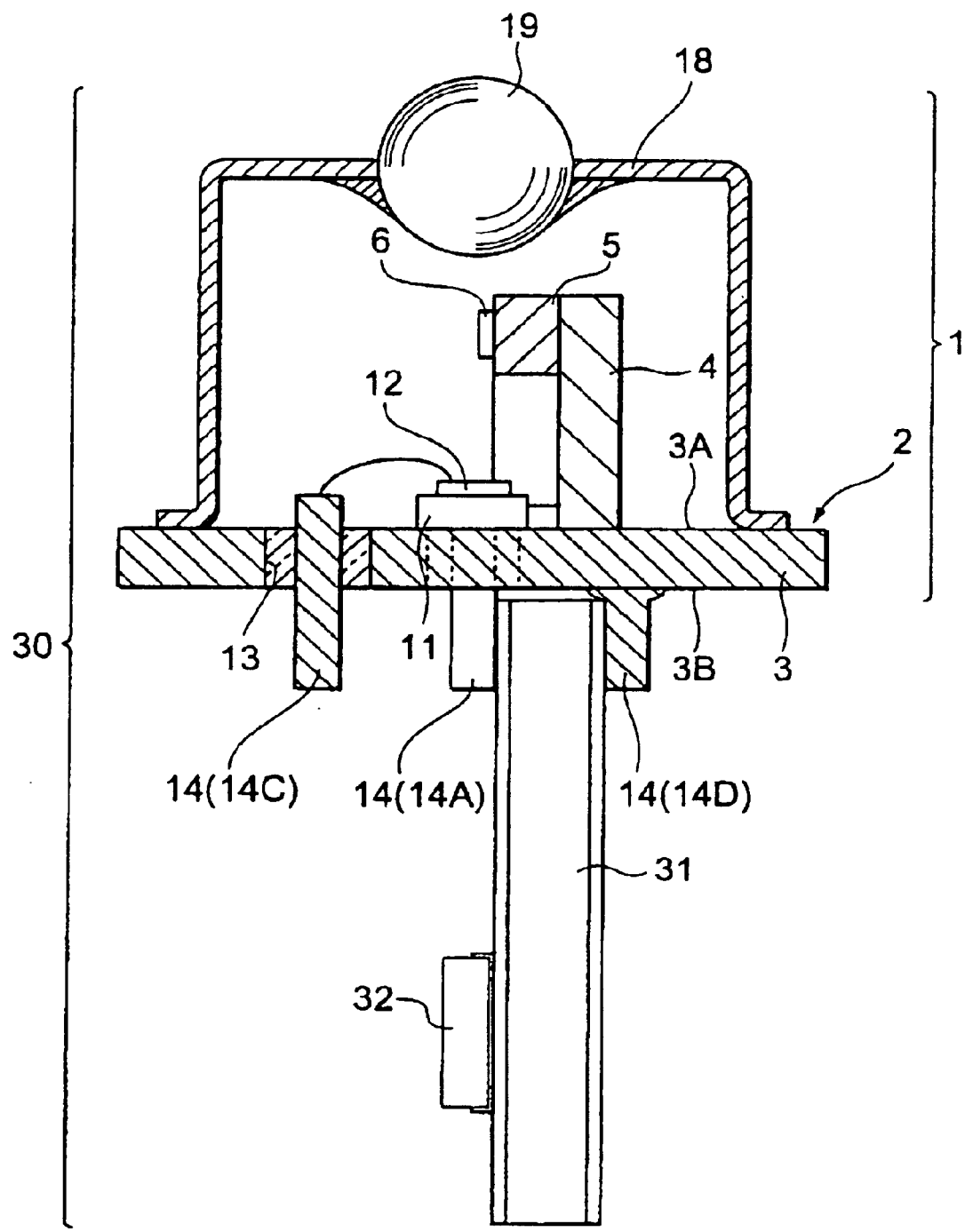
FIG. 9 is a longitudinal sectional view of the semiconductor laser apparatus with the laser module according to a third embodiment.

Referring to FIG. 9, the third embodiment of the present invention will now be described. FIG. 9 is a longitudinal sectional view of the semiconductor laser apparatus according to this embodiment. As shown in FIG. 9, the laser apparatus 30 has the laser module 1 of the first embodiment, and a driver circuit board 31 attached to the bottom side of the stem base 3 of the laser module 1. A driver circuit 32, which is used for driving the laser diode 6, is mounted on the top surface of the driver circuit board 31, and electrically connected to the lead pins 14A and 14B. The driver circuit board 31 has ground pattern on its bottom surface, and the side face of the lead pin 14D is in contact with the ground pattern in order to ground the lead pin 14D. The lead pin 14D is attached to the bottom surface 3B of the stem base 3, by welding or by soldering with a silver solder, for example.

Figure 10:
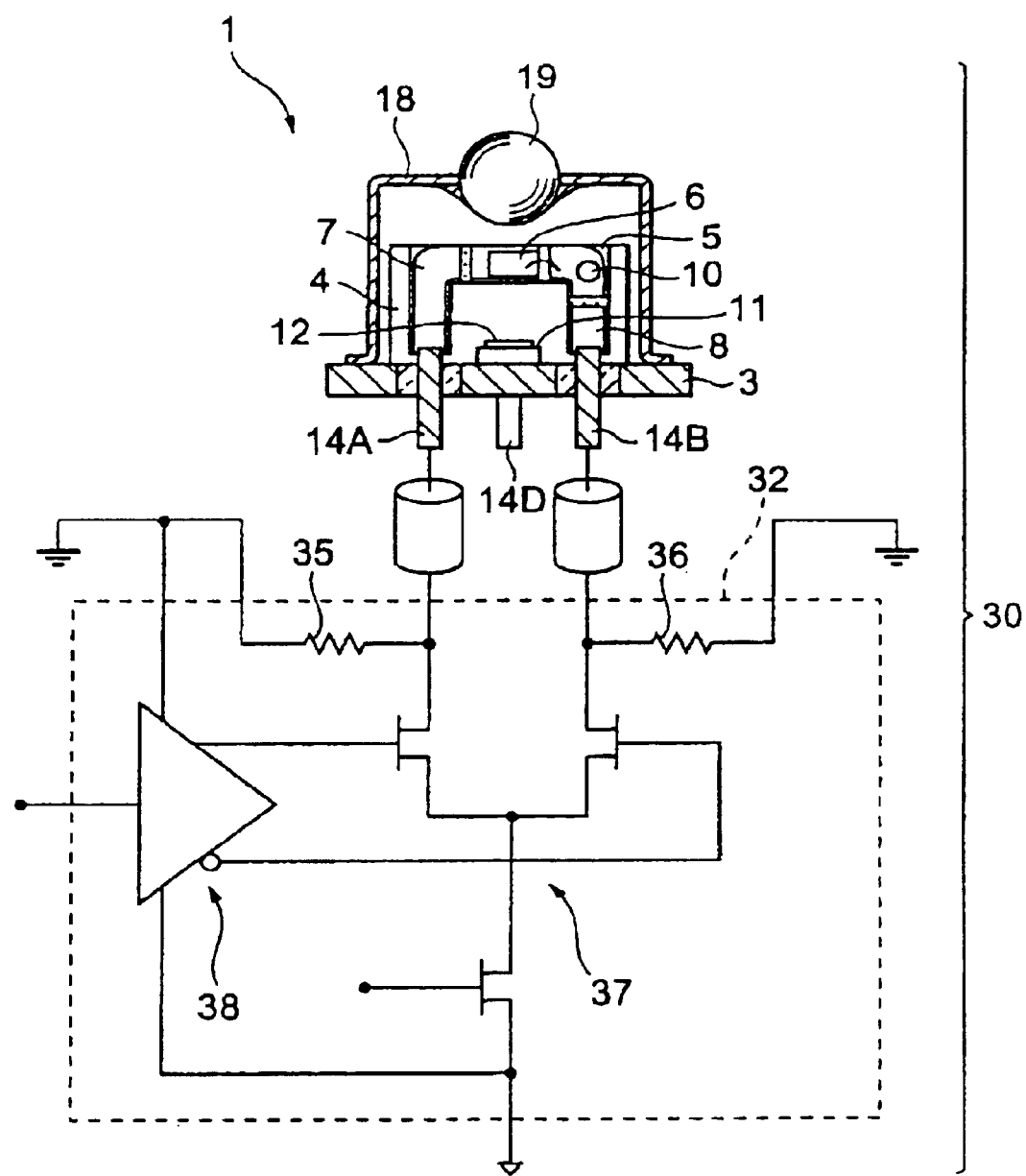
FIG. 10 is a circuit diagram of the driver circuit connected to the laser module.

FIG. 10 is a diagram showing the driver circuit 32. The driver circuit 32 includes terminating resistors 35 and 36 at its outputs, as shown in FIG. 10. The resistors 35 and 36 are electrically connected to the lead pins 14A and 14B, respectively. The circuit board 31 The driver circuit 32 also includes a differential output part 37 and amplifier part 38. The terminating resistors 35 and 36 prevent multiple reflections between the laser module 1 and driver circuit 32, thereby providing the optical output with high quality.

The resistance of each terminating resistor is preferably matched with the impedance of the corresponding transmission line on the driver circuit board 31, or set at impedance close to it. We conducted simulations about high-frequency characteristics by using the driver circuit boards with a transmission line having the impedance of 25 Ω and the terminating resistors of various resistances. Their resistances were set at 25 Ω, 50 Ω, and 100 Ω. The simulations were also performed for a sample without the terminating resistors.

Figure 11:
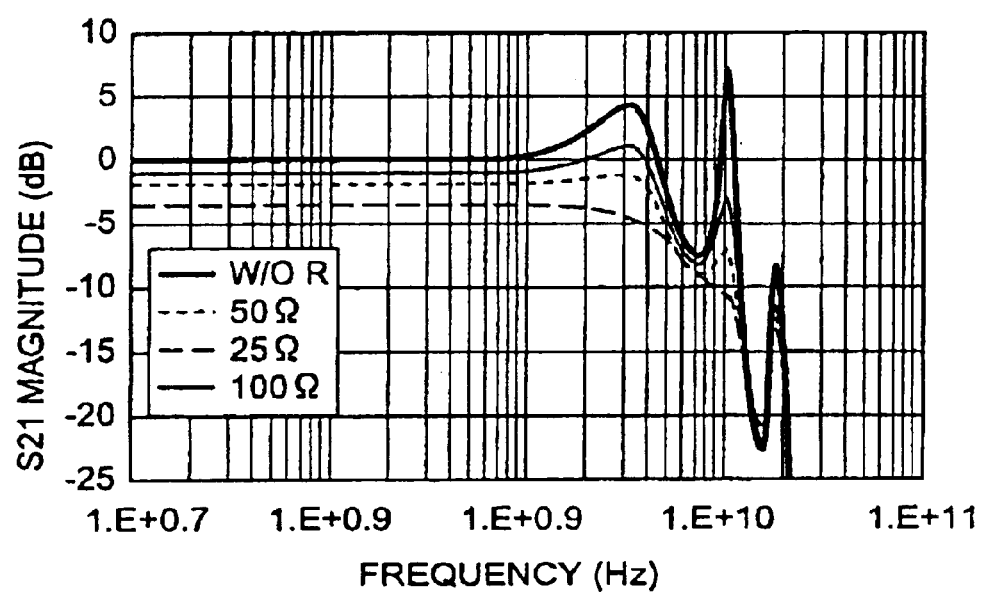
FIG. 11 is a graph showing the frequency response of the laser module where the driver circuit is provided with terminating resistors.

FIG. 11 shows the results of the simulations. As seen from FIG. 11, the terminating resistors 35 and 36 at the driver circuit outputs can reduces the peaks in the frequency response due to the reflections between the laser diode 6 and the driver circuit 32. The resistances of the terminating resistors 35 and 36 may be determined in the range of 25 Ω to 100 Ω in practical use. The resistance of 25 Ω matches the impedance of the transmission line in the driver circuit 32; however, this increases loss of driving current. Therefore the resistances are preferably set in the range of 25 Ω to 100 Ω approximately.

Figure 12A:
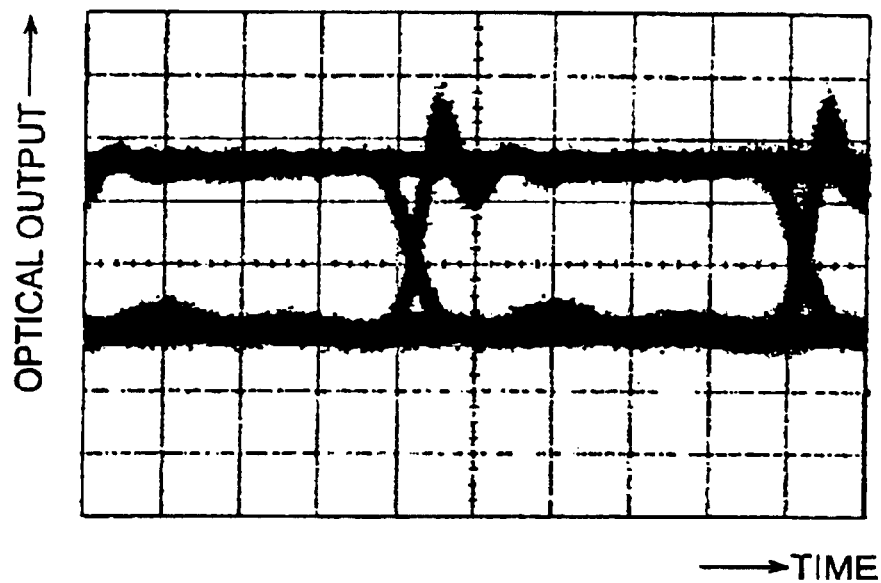
FIG. 12a is a diagram showing an optical output waveform where the driver circuit is provided with terminating resistors, and FIG. 12b a diagram showing an optical output waveform where the driver circuit is configured without terminating resistors.
Figure 12B:
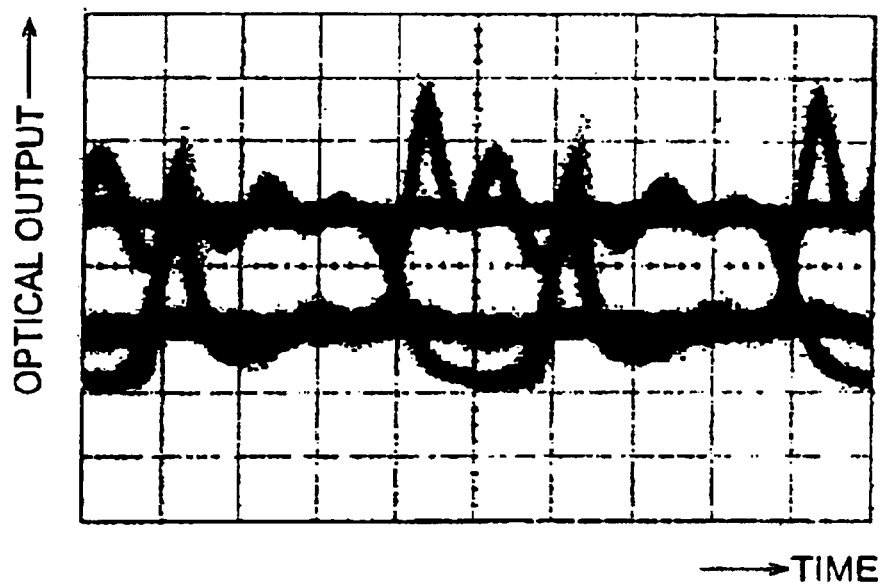

The waveforms of the optical outputs were measured for the laser apparatuses with and without the terminating resistors at the outputs of the driver circuit 32. The results of the measurements are shown in FIGS. 12a and 12b. FIG. 12a shows the result for the laser apparatus with the terminating resistors of 50 Ω, and FIG. 13b shows the result for the laser apparatus without the terminating resistors. As seen from FIGS. 12a and 12b, the optical output with stable waveform was obtained for the laser apparatus with the terminating resistors, though the optical output with instable waveform was obtained for the laser apparatus without the terminating resistors. This verifies that the terminating resistors 35 and 36 facilitate obtaining the stable optical output of the laser apparatus 30.

Fourth Embodiment

Figure 13:
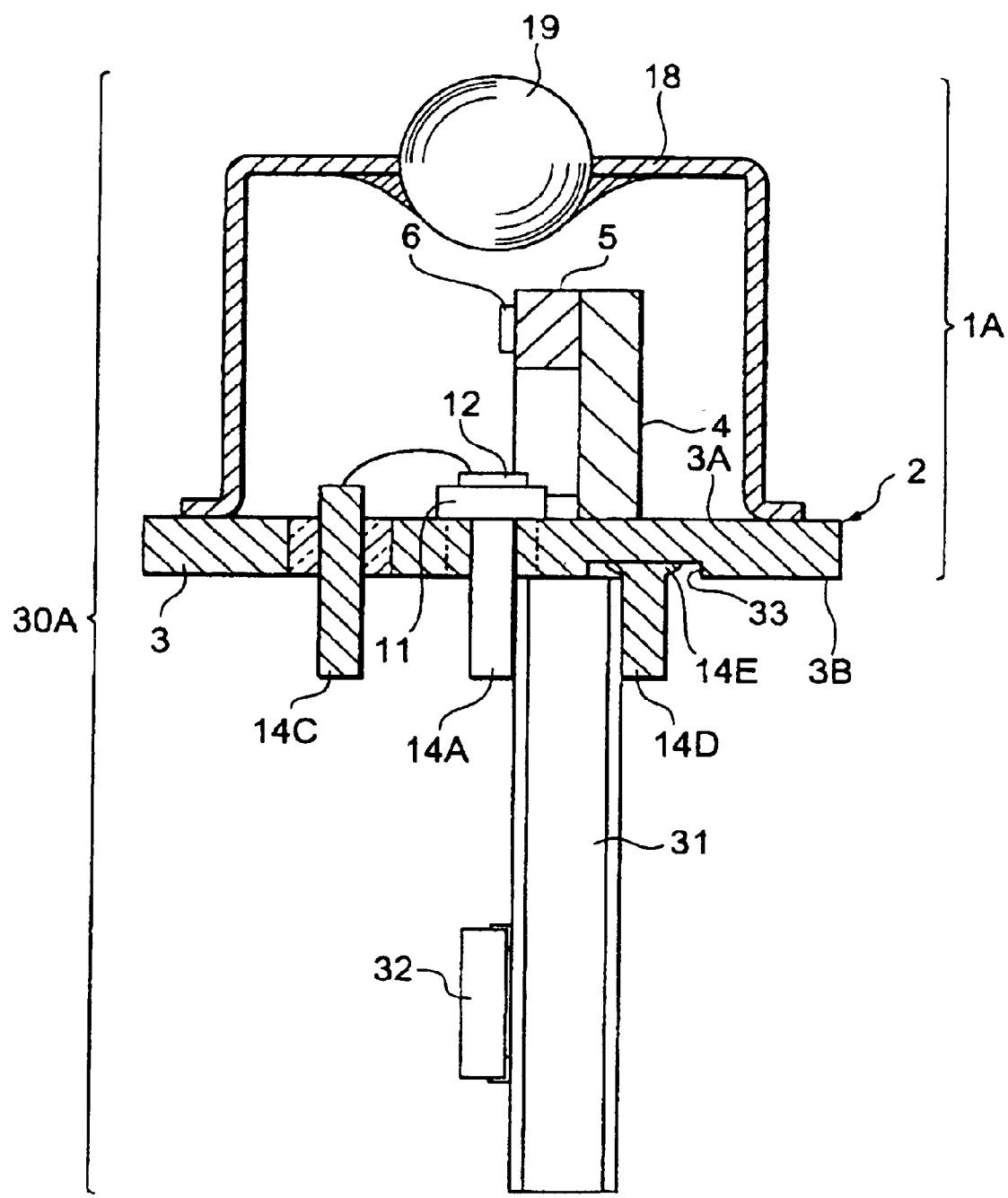
FIG. 13 is a longitudinal sectional view of the semiconductor laser apparatus with the laser module according to a fourth embodiment.

Referring to FIG. 13, the fourth embodiment of the present invention will now be described. FIG. 13 is a longitudinal sectional view of the semiconductor laser apparatus with the laser module according to this embodiment. As shown in FIG. 13, the laser apparatus 30A has the driver circuit board 31 attached to the bottom side of the stem base 3 of the laser module 1A. The laser module 1A differs from the above laser module 1 in that the module 1A has a recess 33 on the bottom surface 3B of the stem base 3. The recess 33 is formed at the position where the lead pin 14D abuts the bottom surface 3B. The laser apparatus 30A has otherwise the same configuration as the laser apparatus 30 of the third embodiment.

The lead pin 14D is attached to the bottom surface 3B of the stem base 3, by welding or by soldering with a silver solder, for example, and accordingly burr 14E remains at the joint. The recess 33 accepts the burr 14E, thereby preventing the burr 14E from intruding between the stem base 3 and the driver circuit board 31 when the board 31 is attached to the stem base 3 while being in contact with the lead pin 14D. This enables close adhesion between the driver circuit board 31 and the bottom surface 3B of the stem base 3, and hence the ground potential can be set appropriately for the driver circuit board 31 and the laser diode 6. Thus the high-frequency characteristics can be improved and the radiation noise can be reduced.

Fifth Embodiment

Figure 14A:
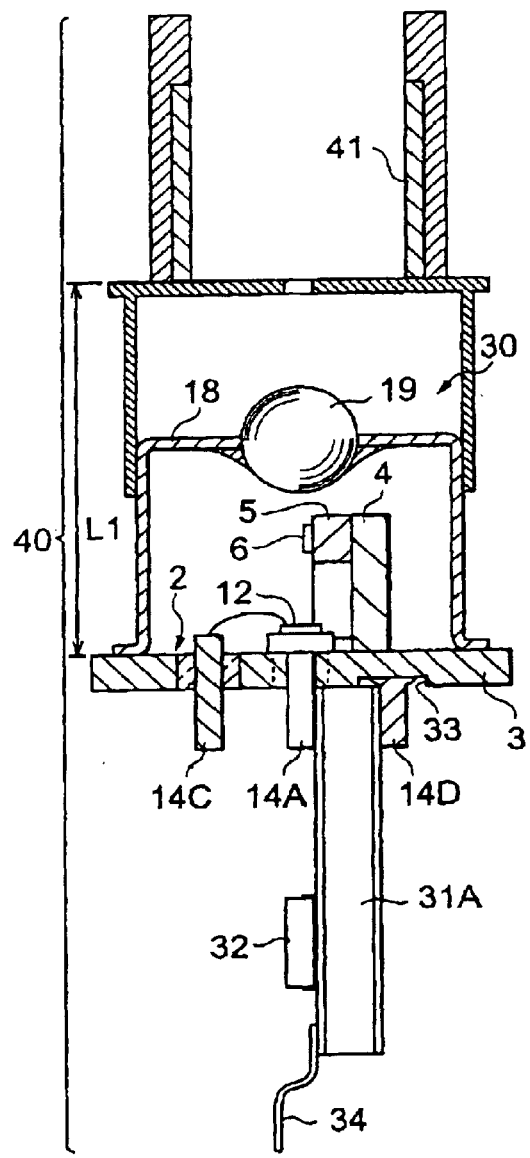
FIGS. 14a and 14b are longitudinal sectional views of the semiconductor laser apparatus according to a fifth embodiment.
Figure 14B:
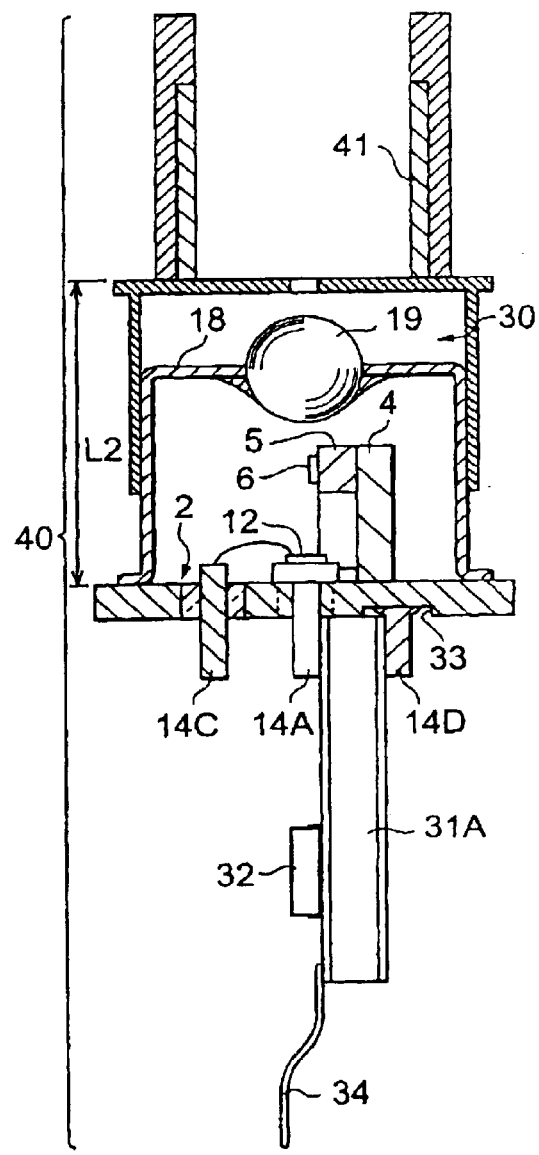

Referring to FIGS. 14a and 14b, the fifth embodiment of the present invention will now be described. FIGS. 14a and 14b are longitudinal sectional views of the semiconductor laser apparatus according to this embodiment. As shown in FIG. 14a, is the laser apparatus 40 has a driver circuit board 31A. The driver circuit board 31A has a flexible board 34 which is used to connect the board 31A to an external main board (not shown). The main board includes a large-scale circuit, control circuit, and so on. The flexible board 34 connects the driver circuit board 31 to the main board so as to allow adjustment of the distance between them due to the flexibility of the board 34. A sleeve 41 is attached to the cap 18 to enable connection between the laser apparatus 40 and an external optical fiber connector. The laser apparatus 40 has otherwise the same configuration as the laser apparatus 30 of the third embodiment.

Such a laser apparatus requires optical alignment upon its production in order to achieve efficient optical coupling between the laser apparatus and the optical fiber in an optical connector to be connected to the laser apparatus. Accordingly, the distance L between the stem base 3 and the sleeve 41 varies, and hence dimensional tolerance becomes larger. When the variation of the distance L is to be absorbed by the joint between the lead pins and the driver circuit board, it is difficult to appropriately set the ground potential for the lead pins and the driver circuit board.

In contrast, the laser apparatus 40 has the driver circuit board 31 connected to the main board with he flexible board 34, so that the variation of the distance L can be absorbed by the flexible board 34. For example, when the distance L1 is relatively long as shown in FIG. 14a, the flexible board 34 is bent to a shorter length. On the other hand, when the distance L2 is relatively short as shown in FIG. 14b, the flexible board 34 is expanded to a longer length. Since the variation of the distance L can be absorbed by the flexible board 34 in this way, the driver circuit board 31 can be kept in close contact with the bottom surface 3B of the stem base 3. As a result, the ground potential can be set appropriately for the driver circuit board 31 and the stem base 3. Thus the high-frequency characteristics can be improved and the radiation noise can be reduced.

Sixth Embodiment

Figure 15:
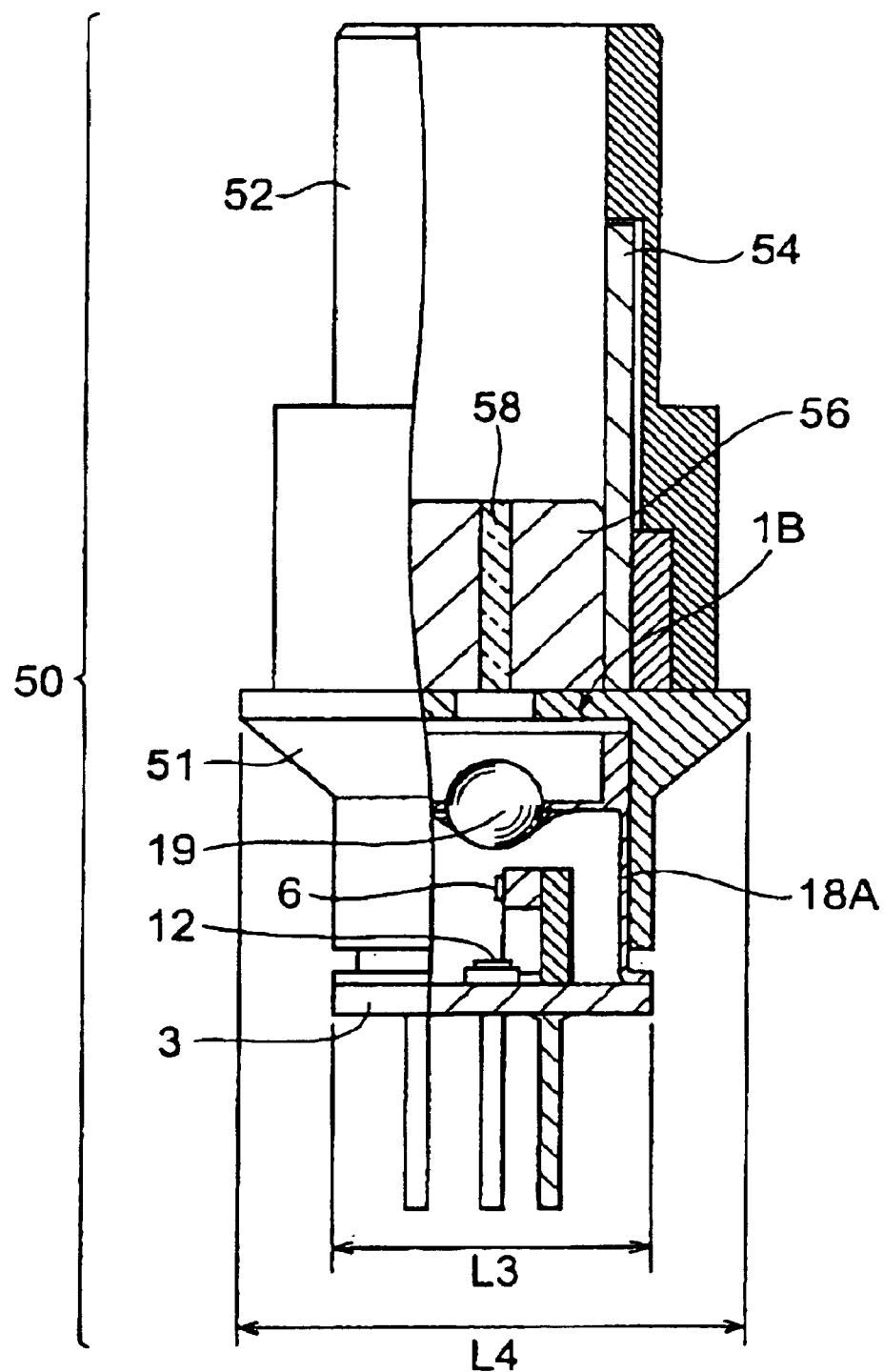
FIG. 15 is a partial sectional view of the semiconductor laser module according to a sixth embodiment.

Referring to FIG. 15, the sixth embodiment of the present invention will now be described. FIG. 15 is a partial longitudinal sectional view of the semiconductor laser module according to this embodiment. As shown in FIG. 15, the laser module 50 has a sleeve 52, which is used to connect the laser module 50 to an optical fiber connector. The sleeve 52 covers a split sleeve 54, and the split sleeve 54 holds a fiber stub 56 inside. The fiber stub 56 has a through hole at its center, and an optical fiber 58 is secured in the through hole. An adapter sleeve 51 is provided between the sleeve 52 and the cap 18A attached to the stem base 3, for connection between the sleeve 52 and the cap 18A. The adapter sleeve 51 covers the cap 18A, and the sleeve 52 is attached to the top of the sleeve 51. The laser module 50 has otherwise the same configuration as the laser module 1 of the first embodiment.

The adapter sleeve 51 has the cap-side diameter L3 which is smaller than the sleeve-side diameter L4. The cap-side diameter L3 is, for example, 3.8 mm and the sleeve-side diameter L4, for example, 6.0 mm. The adapter sleeve 51 has a taper-shaped portion with the diameter decreasing along the axis of the sleeve 51 from the optical fiber 58 toward the laser diode 6.

The cap 18A and stem base 3 can be compact compared to the optical fiber connector to be connected to the sleeve 52 because the adapter sleeve 51 is smaller in diameter on the cap side than on the sleeve side. As the size of the periphery of the laser diode 6 becomes smaller, the parasitic inductance of the laser module 50 can be reduced more easily, and thus the high-frequency characteristics can be improved. Furthermore, because of its taper shape, the adapter sleeve 51 is unlikely to hinder the work of joining the adapter sleeve 51 to the cap 18A, by YAG welding, for example.

Figure 16A:
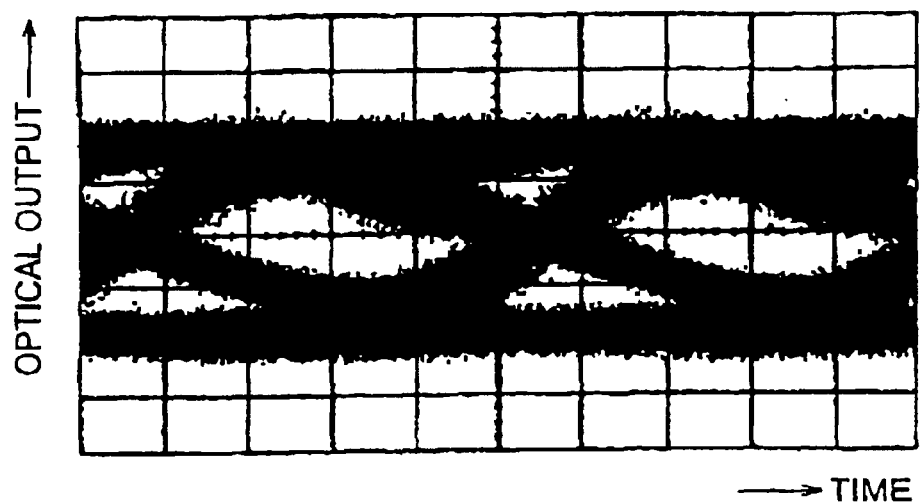
FIG. 16a is a diagram showing an optical output waveform of a semiconductor laser module as a comparative example, and FIG. 16b a diagram showing an optical output waveform of the laser module shown in FIG. 15.
Figure 16B:

Explained here are the results of experiments conducted to verify the effect of the adapter sleeve 51. FIG. 16a shows the waveform of the optical output from the laser module in which the sleeve-side diameter is equal to the cap-side diameter, as a comparative example, and FIG. 16b shows the waveform of the optical output from the laser module 50 of this embodiment. As seen from FIGS. 16a and 16b, the laser module 50 of this embodiment shows faster rise and fall time than the comparative laser module. We believe this is caused by the improvement in the high-frequency characteristics according to the downsizing of the laser module. Thus the superior high-frequency characteristics can be achieved.

Seventh Embodiment

Figure 17:
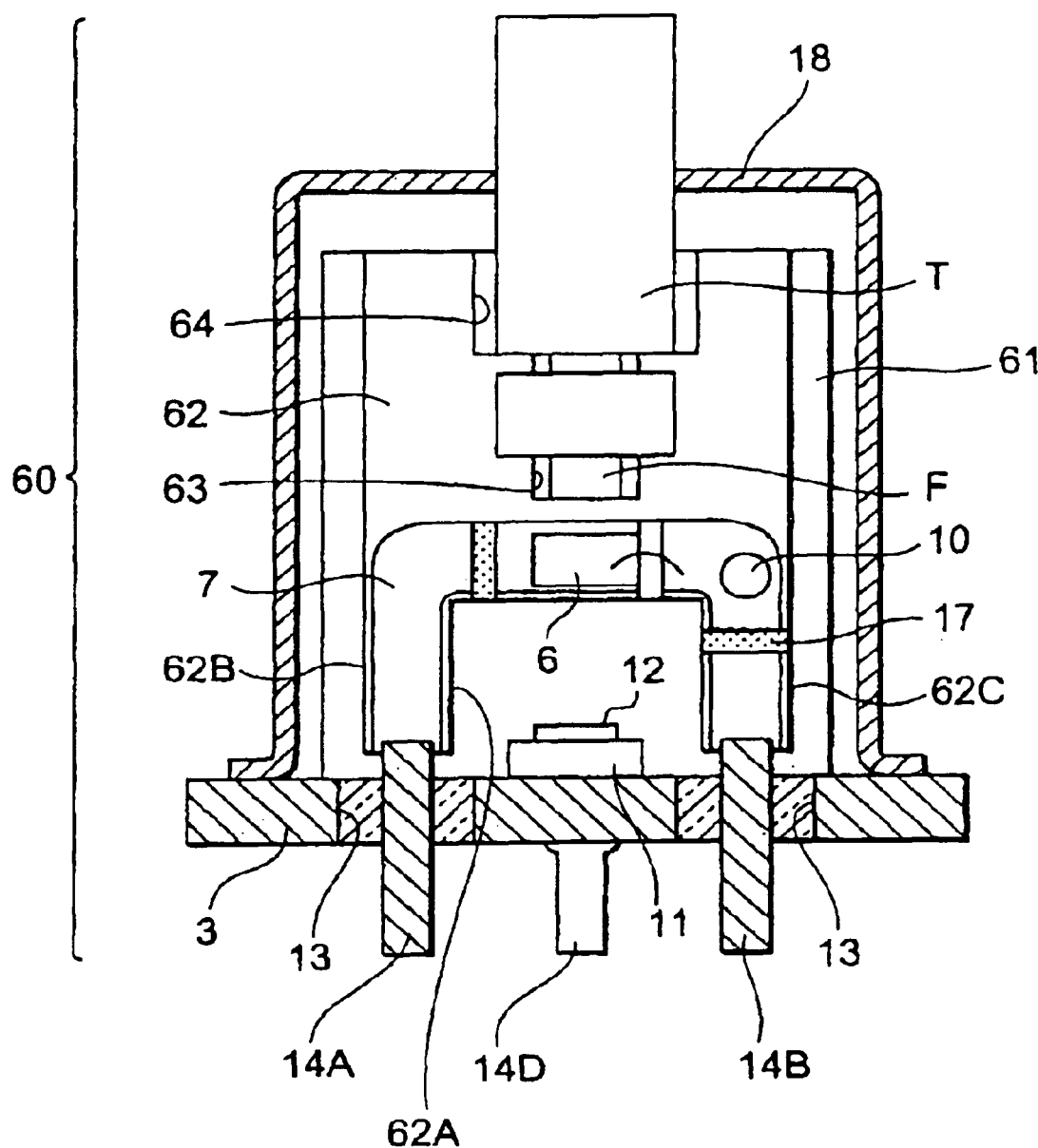
FIG. 17 is a longitudinal sectional view of the semiconductor laser module according to a seventh embodiment.

Referring to FIG. 17, the seventh embodiment of the present invention will now be described. FIG. 17 is a longitudinal sectional view of the semiconductor laser module according to this embodiment. The laser module 60 includes a stem block 61 taller than the stem block 4 in the previous embodiments. A submount 62 has a aperture 62A at its lower middle, and legs 62 B and 62C extending parallel to each other. The submount 62 is fixed on the stem block 61, and the PD submount 11 and photodiode 12 are placed below the aperture 62A. The laser diode 6 is mounted on the submount 62 to be positioned right above the photodiode 12.

A small V-shaped groove 63 is formed, as a guide groove for an optical fiber, on a surface of the submount 62 to be located above the laser diode 6, and an optical fiber F is placed in the groove 63. The depth of the groove 63 is adjusted so that the optical axis of the fiber F is aligned with that of the laser diode 6. A large V-shaped groove 64 is formed on the surface of the submount 62 as a continuation of the groove 63. The groove 64 extends upwardly away from the laser diode 6. The depth of the groove 64 is greater than that of the groove 63, and a tube T for protecting the optical fiber F is placed in the groove 64. The laser module 60 has otherwise the same configuration as the first embodiment.

The small V-shaped groove 63 facilitates optical coupling between the optical fiber F and the laser diode 6. Since the fiber F is aligned with the laser diode 6 by merely placing the fiber F in the groove 63, there is no need for complicated alignment using lenses.

The preferred embodiments of the present invention were described above, but it is noted that the present invention is by no means intended to be limited to the above embodiments. For example, in the above embodiments, the first transmission line 7 was connected to the cathode 6B of the laser diode 6 and the second transmission line 8 to the anode 6A; however, the first transmission line 7 may be connected to the anode 6A and the second transmission line 8 to the cathode 6B.

Figure 18:
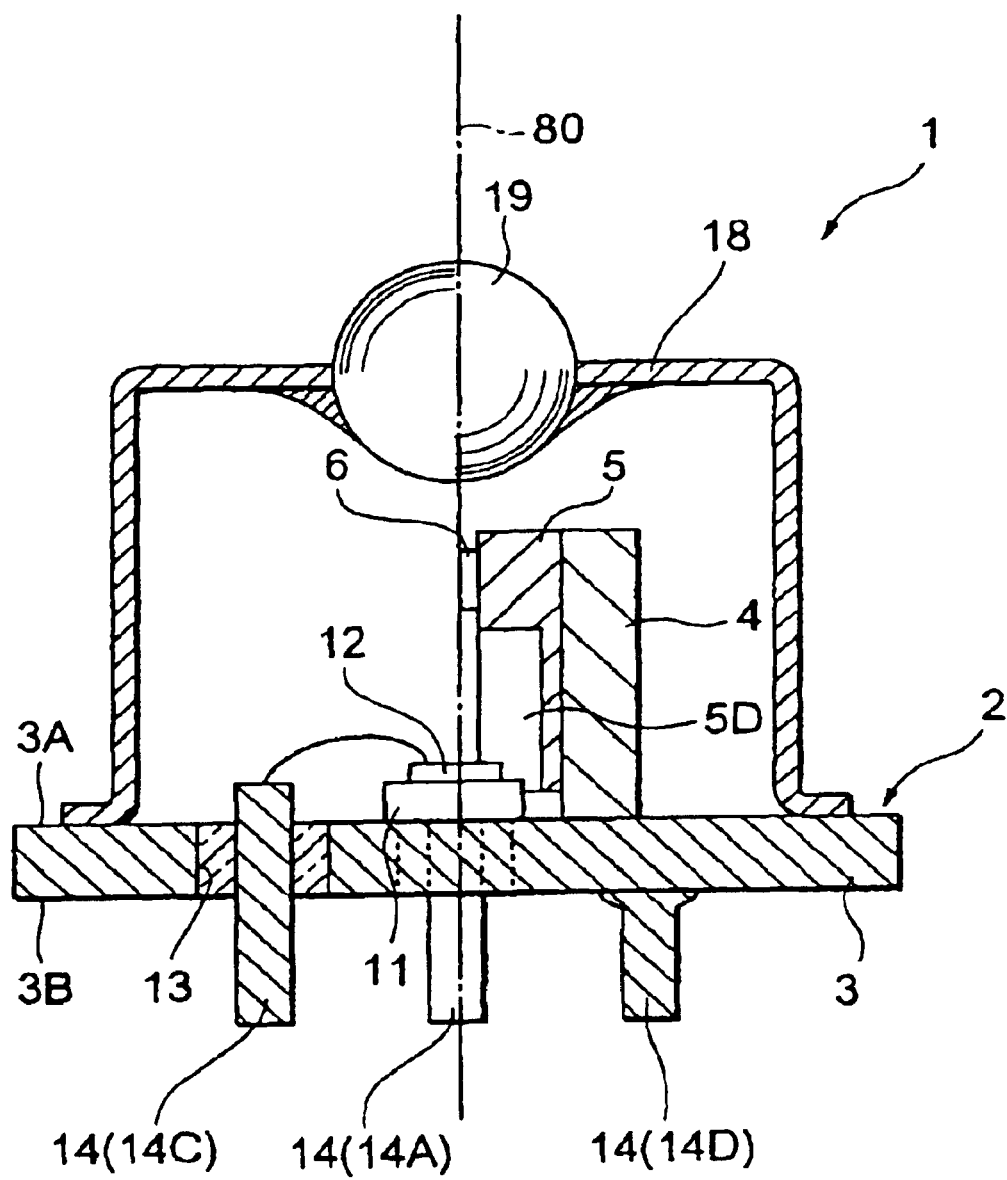
FIG. 18 is a longitudinal sectional view showing modification of the submount in the laser module.

In the above embodiments, the submount 5 has the aperture 5A extending through the submount 5, as the space for placement of the photodiode 12; however, the aperture of the submount may be a recess extending partially in the submount. As shown in FIG. 18, the submount 5 may have a recess 5D for placement of the photodiode 12, instead of the aperture 5A. The recess 5D is formed on an edge of the submount 5 without extending through the submount, and open where the recess 5D faces the top surface 3A of the stem base 3. The photodiode 12 and the PD submount 11 are partially disposed in the recess 5D.

The submount 5 may have reverse V-shape on front view instead of the reverse U-shape described above. The aperture 5A and recess 5D has a cross section of rectangle; however they may have a cross section of triangle. The aperture 5A and recess 5D both have the angular corners; however, they may have round corners.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A semiconductor laser module comprising:
    a stem base having a top surface and bottom surface;
    a submount provided on the top surface of the stem base;
    a laser diode mounted on the submount;
    a photodetector placed, below the laser diode, on the stem base;
    a first lead pin for supplying a normal-phase current to the laser diode, the first lead pin extending through the stem base; and a second lead pin for supplying a reverse-phase current to the laser diode, the second lead pin extending through the stem base, the submount has having an aperture extending through the submount, the submount being open at a portion where the aperture faces the stem base, and the photodetector being at least partially disposed within the aperture.

2. The semiconductor laser module according to claim 1, wherein the laser diode and the photodetector have a common optical axis.

3. The semiconductor laser module according to claim 1, wherein the laser diode has an anode and a cathode, and wherein the submount has first and second transmission lines, the first transmission line being electrically connected between the first lead pin and one of the anode and cathode, and the second transmission line being electrically connected between the second lead pin and the other of the anode and cathode.

4. The semiconductor laser module according to claim 3, further comprising a stem block provided on the top surface of the stem base, wherein the submount is fixed on the stem block.

5. The semiconductor laser module according to claim 4, further comprising:

a coding wire connected between the second transmission line and the other of the anode and cathode; and a via extending through the submount between the second transmission line and the stem block;

wherein the stem block is electrically conductive; and wherein the other of the anode and cathode is electrically connected to the stem block through the bonding wire, second transmission line and via.

6. The semiconductor laser module according to claim 3, wherein the first transmission line includes a portion extending parallel to a portion of the second transmission line.

7. The semiconductor laser module according to claim 3, wherein the laser diode has an optical axis, and wherein the first and second transmission lines are symmetric with respect to the optical axis.

8. The semiconductor laser module according to claim 3, wherein the submount has first and second legs extending parallel to each other, and wherein the first and second transmission liens are disposed on the first and second legs, respectively.

9. The semiconductor laser module according to claim 8, wherein the first and second legs straddle the photodetector.

10. The semiconductor laser module according to claim 3, wherein a resistive element is provided in at least either of the first and second transmission lines.

11. The semiconductor laser module according to claim 1, further comprising a ground lead pin for grounding the stem base, wherein a depression is formed on the bottom surface of the stem base, and wherein an end of the ground lead pin is attached to the stem base in the depression.

12. The semiconductor laser module according to claim 1, further comprising a cap attached to the stem base, a first sleeve for optical coupling between the laser module and an external optical component, and a second sleeve for interconnection between the cap and first sleeve, wherein the second sleeve has a first portion placed near the cap and a second portion placed near the first sleeve, and wherein an outside diameter of the first portion is smaller than that of the second portion.

13. The semiconductor laser module according to claim 1, wherein a guide groove is formed on the submount, and wherein an optical fiber is placed in the guide grove, the guide groove having a depth at which the optical fiber is aligned with the laser diode to achieve optical coupling.

14. A semiconductor laser apparatus, comprising:

the semiconductor laser module according to claim 1, and a driver circuit board for driving the laser diode of the laser module, the driver circuit board being electrically connected to the first and second input lead pins of the laser module.

15. A semiconductor laser apparatus according to claim 14, wherein the laser module further comprises a ground lead pin for grounding the stem base, wherein a depression is formed on the bottom surface of the stem base, wherein an end of the ground lead pin is attached, in the depression, to the stem base, and wherein the driver circuit board has a ground wiring to be connected to a ground potential, the ground pattern being in contact with the ground lead pin.

16. The semiconductor laser apparatus according to claim 14, wherein the driver circuit board is in contact with the bottom surface of the stem base.

17. The semiconductor laser apparatus according to claim 14, wherein the driver circuit board has a flexible board used for electric connection between the driver circuit board and an external circuit.

18. The semiconductor laser apparatus according to claim 14, wherein the driver circuit, board includes a terminating resistor for impedance matching.

19. A semiconductor laser module comprising:

a stem base having a top surface and bottom surface;

a submount provided on the top surface of the stem base;

a laser diode mounted on the submount;

a photodetector placed, below the laser diode, on the stem base;

a first lead pin for supplying a normal-phase current to the laser diode, the first lead pin extending through the stem base; and a second lead pin for supplying a reverse-phase current to the laser diode, the second lead pin extending through the stem base;

the submount having a recess formed on an edge of the submount, the submount being open at a portion where the recess faces the stern base, and the photodetector being at least partially disposed within the recess.

* * * * *